(12) United States Patent
Lee et al.

(10) Patent No.: US 11,123,803 B2
(45) Date of Patent: Sep. 21, 2021

(54) CUTTING INSERT FOR HARD-TO-CUT MATERIAL

(71) Applicant: KORLOY INC., Seoul (KR)

(72) Inventors: Sung-gu Lee, Cheongju-si (KR); Se-ung Oh, Cheongju-si (KR); Seung-Su Ahn, Cheongju-si (KR)

(73) Assignee: KORLOY INC., Seoul (KR)

( * ) Notice: Subject to any disclaimer, the term of this patent is extended or adjusted under 35 U.S.C. 154(b) by 42 days.

(21) Appl. No.: 16/690,717

(22) Filed: Nov. 21, 2019

(65) Prior Publication Data

US 2020/0171583 A1  Jun. 4, 2020

(30) Foreign Application Priority Data

Nov. 30, 2018 (KR) .................. 10-2018-0151845

(51) Int. Cl.
| | | |
|---|---|---|
| *B23B 27/14* | (2006.01) | |
| *C22C 29/08* | (2006.01) | |
| *B23C 5/20* | (2006.01) | |
| *C23C 14/06* | (2006.01) | |

(52) U.S. Cl.
CPC ............ *B23B 27/148* (2013.01); *B23C 5/202* (2013.01); *C22C 29/08* (2013.01); *C23C 14/0641* (2013.01); *B23C 2222/28* (2013.01); *C22C 2202/00* (2013.01)

(58) Field of Classification Search
CPC .... B23B 27/148; C22C 29/08; C22C 2222/28
USPC .......................... 407/119; 428/697, 698, 699
See application file for complete search history.

(56) References Cited

U.S. PATENT DOCUMENTS

| | | | | |
|---|---|---|---|---|
| 2008/0075543 A1* | 3/2008 | Zhu | ................ | C04B 41/009 407/119 |
| 2015/0152561 A1* | 6/2015 | Kang | ................ | C23C 14/0641 428/698 |
| 2015/0376744 A1* | 12/2015 | Konyashin | ............ | C22C 29/067 51/309 |

FOREIGN PATENT DOCUMENTS

| | | |
|---|---|---|
| CN | 101210310 A | 7/2008 |
| CN | 105980602 A | 9/2016 |
| JP | 5-98385 A | 4/1993 |
| JP | 2004-90150 A | 3/2004 |
| JP | 2006-111890 * | 4/2006 |
| JP | 2006-218589 A | 8/2006 |
| JP | 2006-326688 A | 12/2006 |
| JP | 2009-50997 A | 3/2009 |
| JP | 2011-80153 A | 4/2011 |
| JP | 2011-235410 * | 11/2011 |
| JP | 2015-160270 * | 9/2015 |
| KR | 10-2010-0130752 A | 12/2010 |
| KR | 20120002137 * | 1/2012 |
| KR | 10-2015-0073707 A | 7/2015 |

(Continued)

*Primary Examiner* — Archene A Turner
(74) *Attorney, Agent, or Firm* — Novick, Kim & Lee, PLLC; Jae Youn Kim; Jihun Kim

(57) ABSTRACT

Disclosed is a PVD ceramic thin film-coated cutting insert properly usable for machining a hard-to-cut material such as inconel or titanium having low thermal conductivity. The cutting insert for hard-to-cut materials includes a cemented carbide base material having an SMS value of 50-80% obtained by [Formula 1] below, and a ceramic thin film formed on the cemented carbide base material and having a thickness of about 0.4-1.5 μm. [Formula 1]: SMS=Saturation magnetization value of sintered body×100/TMS, where TMS=2010×Mass ratio of Co.

7 Claims, 2 Drawing Sheets

(56) References Cited

FOREIGN PATENT DOCUMENTS

| KR | 10-1792534 | B1 | 11/2017 |
| KR | 10-1859644 | B1 | 5/2018 |

\* cited by examiner

CUTTING INSERT FOR HARD-TO-CUT MATERIAL

BACKGROUND OF THE INVENTION

1. Field of the Invention

The present invention relates to a PVD ceramic thin film-coated cutting insert properly usable for machining of a hard-to-cut material such as inconel or titanium having low thermal conductivity.

2. Description of the Related Art

For base materials for wear-resistant tools or cutting tools used for cutting metals, cemented carbide (WC—Co alloy), cermet which use TiC, Ti(C, N) and the like as a hard material and use Co, Ni or Fe as a binder, ceramic, high-speed steel, or the like are used.

Among these, cemented carbide is a composite material in which hard tungsten carbide (WC) particles are dispersed in a binder metal such as cobalt (Co), nickel (Ni), or iron (Fe) having excellent toughness, and has been widely used as a base material for cutting tools due to high hardness and high toughness. In order to improve mechanical properties such as wear resistance, toughness, high-temperature characteristics of such base materials for cutting tools, a fine granular structure is obtained by adding a crystal grain growth suppression material such as vanadium carbide (VC), or a fine structure control of reducing or enriching the concentration of a binder metal on the surface of a sintered body has been widely used.

Inconel, titanium alloys, and the like which correspond to group S in the ISO workpiece material classification have low thermal conductivity while having high hardness and tensile strength, and thus belong to hard-to-cut materials. In general, in the machining of hard-to-cut materials, a sharp nose shape for improving cut sharpness of a cutting tool is applied, and such a configuration is an alternative for minimizing a built-up edge in a low-speed machining of a hard-to-cut material having high hardness and weldability.

However, in the machining of a hard-to-cut material having very low thermal conductivity, process heat is concentrated to the cutting edge of a sharp cutting insert, and therefore it is very difficult to effectively prevent damage to the cutting edge due to welding. For such reasons, in general, a ceramic material is coated on a cutting insert for machining hard-to-cut materials for heat insulation effect and wear resistance improvement effect, and for preventing welding with a cemented carbide base material.

Meanwhile, when observing a damaged portion in a cutting edge after using a cutting insert coated with a ceramic material for machining of a hard-to-cut material, it can be found that welding with a base material and abrupt wear proceeds while peeling and chipping damage of a ceramic thin film occurs. Thus, in order to extend the service life of a cutting insert for hard-to-cut materials, it is important to suppress peeling and chipping damage occurring during cutting.

Patent Document 1

(Patent document 1) Korean Patent Publication No. 10-1859644

SUMMARY OF THE INVENTION

The present invention addresses the problem of providing a cutting insert which is capable of suppressing plastic deformation of a ceramic thin film occurring on a cutting edge portion of the cutting insert during cutting of hard-to-cut materials and thereby delaying peeling or chipping of the ceramic thin film.

In order to solve the abovementioned problem, the present invention provides a cutting insert for hard-to-cut materials which includes a cemented carbide base material having an SMS value of about 50-80% obtained by [Formula 1] below; and a ceramic thin film formed on the cemented carbide base material and having a thickness of about 0.4-1.5 µm.

$SMS$=Saturation magnetization amount of sintered body×100/$TMS$ $TMS$=2010×Mass Ratio of Co            [Formula 1]

BRIEF DESCRIPTION OF THE DRAWINGS

The following drawings attached to the specification illustrate preferred examples of the present invention by example, and serve to enable technical concepts of the present invention to be further understood together with detailed description of the invention given below, and therefore the present invention should not be interpreted only with matters in such drawings.

DETAILED DESCRIPTION OF THE EXEMPLARY EMBODIMENTS

Figure 1:
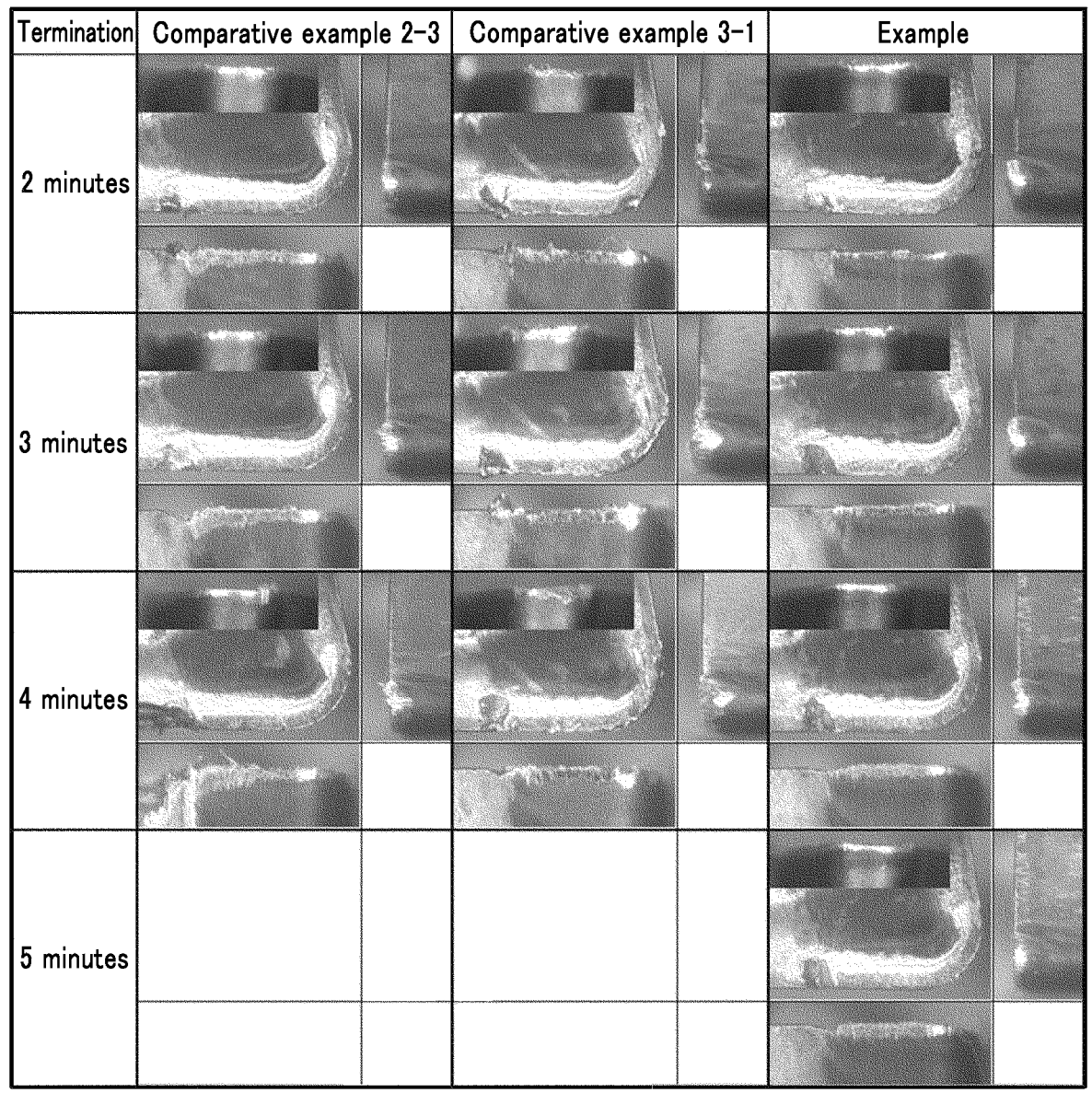
FIG. 1 illustrates a state after a cutting test for a cutting insert according to an example and a comparative example of the invention.

Hereinafter, embodiments of the present invention will be described with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

The inventors found that during machining of hard-to-cut materials, a slight plastic deformation occurs at the edge tip of a cutting insert under a high temperature and a high pressure, a ceramic thin film is broken by such a slight plastic deformation, and therefore rapid welding occurs at an exposed base material portion and is continued to a large falling off of a welded part, and consequently causes damage to the edge tip. Accordingly, the inventors confirmed that when suppressing the slight plastic deformation, the service life of the cutting insert could be remarkably improved, and consequently have arrived at the invention.

The cutting insert for hard-to-cut materials according to the invention is characterized by including: a cemented carbide base material having an SMS value of about 50-80% obtained by [Formula 1] below; and a ceramic thin film formed on the cemented carbide base material and having a thickness of about 0.4-1.5 µm.

$SMS$=Saturation magnetization amount of sintered body×100/$TMS$ $TMS$=2010×Mass ratio of Co            [Formula 1]

In the cutting insert according to the invention, cemented carbide having an SMS of about 50-80% is used as a base material to improve plastic deformation resistance, and a ceramic thin film is formed in a small thickness on the base material to thereby suppress the occurrence of slight plastic deformation at the edge tip of a cutting insert under a high temperature and a high pressure.

When the SMS is not within the range of about 50-80%, abnormal structures such as deltas and free carbons may undesirably be generated inside the fine structure of the base material, or the plastic deformation resistance may undesirably be not sufficient. In terms of plastic deformation resistance, more desirable SMS range is about 50-70%.

When the thickness of the ceramic thin film is smaller than about 0.4 μm, it is impossible to obtain the wear resistance required for cutting, and when larger than about 1.5 μm, slight plastic deformation occurs and the service life of the cutting insert is degraded, and thus, the range of about 0.4-1.5 μm is desirable, and the more desirable thickness of the ceramic film is about 0.4-1.0 μm.

In addition, desirably, the cemented carbide base material may include about 4-8 wt % of Co, no more than 5 wt % of a grain growth inhibitor including a metal carbide, a metal carbonitride, a metal carbon oxynitride, or a mixture thereof, the metal being at least one selected from metals in periodic table groups 4, 5 and 6 excluding tungsten (W), and the remainder of WC.

The Co functions as a binder to fix WC, which is a primary hard phase, and exhibits a tendency such that the larger the Co content, the larger the toughness, and the smaller the Co content, the smaller the toughness. When the Co content is less than about 4 wt %, the toughness of the base material becomes insufficient, and when the Co content exceeds about 8 wt %, the plastic deformation resistance becomes low, and thus, about 4-8 wt % is desirable.

When the content of the grain growth inhibitor exceeds about 5 wt %, the binding of WC and the binder degrades and a crack is easily generated between the WC and the binder due to a shock from the outside, and therefore no more than about 5 wt % of the grain growth inhibitor is favorably contained. In addition, when the content of the grain growth inhibitor is less than about 0.1 wt %, reduction in the grain growth inhibiting effect and the plastic deformation resistance may occur, it is more desirable to contain the inhibitor in a content of about 0.1 wt % or more.

In order to increase the plastic deformation resistance, the cemented carbide may further include one or more rare earth elements so as to have a solubility reinforcing effect, and in this case, the sum of the grain growth inhibitor and the rare earth element may be adjusted to be no more than about 5 wt %. For example, Ru, Gd, Re or the like may be used as the rare earth element.

Desirably, the cemented carbide base material does not substantially include an abnormal structure such as a delta (δ) phase or a free carbon phase that degrades mechanical properties.

The cutting insert according to the invention exhibits an excellent characteristics under the cutting speed Vc condition of about 20-100 mm/min and desirably used under the abovementioned cutting conditions.

The adhesion between the cemented carbide base material and the ceramic thin film is desirably maintained at least about 75 N as measured by a scratch tester. When the adhesion is no less than the abovementioned range, the aimed effects of the invention can be achieved, and thus, the upper limit value of the adhesion is not specially limited.

The hardness of the ceramic thin film is desirably no less than about 30 GPa in order to suppress slight plastic deformation during cutting.

The ceramic thin film may be formed in a multilayer structure with one or more layers including $Ti_{1-a-b}Al_aMe_bN$ (Me is at least one selected from among Si, W, Nb, Mo, Ta, Hf, Zr, and Y, where $0.3 \leq a \leq 0.7$, $0 \leq b \leq 0.1$)

EXAMPLE

The cemented carbide which was a base material used for the cutting tool according to the example of the invention was manufactured through the following processes, and cemented carbides according to various compositions and processes were manufactured together for comparison with the base material according to the example of the invention.

To this end, firstly, material powder for manufacturing cemented carbides was manufactured so as to have the composition of Table 1 below.

TABLE 1

| | Base material composition | | | | |
|---|---|---|---|---|---|
| No | WC | Co | $Cr_3C_2$ | Cooling speed | SMS (%) |
| 1 | 94 | 6 | 0 | −2° C./minute | 92 |
| 2 | 94 | 6 | 0 | −10° C./minute | 82 |
| 3 | 93.5 | 6 | 0.5 | −2° C./minute | 77 |
| 4 | 93.5 | 6 | 0.5 | −10° C./minute | 68 |
| 5 | 92.8 | 6 | 1.2 | −2° C./minute | 52 |
| 6 | 92.8 | 6 | 1.2 | −10° C./minute | 47 |

Mixed powder was obtained by adding cemented carbide balls and an inorganic solvent into material powder prepared as described above and performing drying after mixing and pulverizing for about 13 hours. The obtained mixture powder was pressed at a pressure of about 2 ton/cm$^2$ with a CNMA120408 type mold (Korloy Co.) to manufacture a molded body.

Subsequently, a sintering process was performed through a method such that a dewaxing process was performed at about 600° C. to remove the added organic binder component during the molded body manufacturing process, sintering was then performed in an inert gas atmosphere under the conditions of sintering temperature of about 1,450° C. and a sintering time of about 1-2 hours, cooling was performed up to about 600° C. at the cooling speed of Table 1 under an inert gas atmosphere, and then natural cooling was performed.

From the result of measuring the SMS of the cemented carbide sintered body manufactured as described above, the result like Table 1 was obtained. As illustrated in Table 1, the SMS of the sintered body can be variously adjusted by using the difference between the components contained in the base material and the cooling speed.

A cutting insert was manufactured by coating a $Ti_{0.46}Al_{0.52}Si_{0.02}N$ thin film while changing the thickness of the thin film into about 0.3 μm, 0.5 μm, 1.2 μm, and 1.9 μm by using commercially available PVD method on the surface of the cemented carbide base material manufactured as described above.

Cutting Performance Evaluation

The wear resistance of the cutting insert, on which the ceramic thin film was formed as such, is evaluated on the following condition, and the results are arranged in Table 2 below.

Workpiece material: Inconel 718 Φ100
Vc(cutting speed): 50 mm/min
fn(feeding speed): 0.25 mm/rev
ap(depth of cut): 2.0 mm
Dry/Wet type: wet type

TABLE 2

| No. | SMS (%) | Thin film thickness (μm) | Cutting service life (Second) | Service life termination type | Reference |
|---|---|---|---|---|---|
| 1-1 | 92 | 0.3 | 30 | Initial welding wear | Comparative example |
| 1-2 | 92 | 0.5 | 55 | Welding after initial peeling | Comparative example |
| 1-3 | 92 | 1.2 | 60 | Initial peeling + boundary chipping | Comparative example |
| 1-4 | 92 | 1.9 | 60 | Initial peeling + boundary chipping | Comparative example |
| 2-1 | 82 | 0.3 | 45 | Initial welding wear | Comparative example |
| 2-2 | 82 | 0.5 | 120 | Welding after peeling | Comparative example |
| 2-3 | 82 | 1.2 | 90 | Welding after initial peeling | Comparative example |
| 2-4 | 82 | 1.9 | 60 | Initial peeling + boundary chipping | Comparative example |
| 3-1 | 77 | 0.3 | 165 | Welding after peeling | Comparative example |
| 3-2 | 77 | 0.5 | 360 | Peeling welding after normal wear | Example |
| 3-3 | 77 | 1.2 | 305 | Peeling welding after normal wear | Comparative example |
| 3-4 | 77 | 1.9 | 125 | Initial peeling + boundary chipping | Comparative example |
| 4-1 | 68 | 0.3 | 220 | Welding after peeling | Comparative example |
| 4-2 | 68 | 0.5 | 480 | Peeling welding after normal wear | Example |
| 4-3 | 68 | 1.2 | 390 | Peeling welding after normal wear | Example |
| 4-4 | 68 | 1.9 | 135 | Initial peeling + boundary chipping | Comparative example |
| 5-1 | 52 | 0.3 | 280 | Welding after peeling | Comparative example |
| 5-2 | 52 | 0.5 | 420 | Peeling welding after normal wear | Example |
| 5-3 | 52 | 1.2 | 360 | Peeling welding after normal wear | Example |
| 5-4 | 52 | 1.9 | 120 | Initial peeling + boundary chipping | Comparative example |
| 6-1 | 47 | 0.3 | 20 | Initial peeling + base material pulled out | Comparative example |
| 6-2 | 47 | 0.5 | 52 | Initial peeling + base material pulled out | Comparative example |
| 6-3 | 47 | 1.2 | 30 | Initial peeling + base material pulled out | Comparative example |
| 6-4 | 47 | 1.9 | 20 | Initial peeling + base material pulled out | Comparative example |

As confirmed form Table 2 above, the cutting insert, which satisfies the thickness of about 0.5-1.2 μm of the ceramic thin film on the cemented carbide base material that exhibits the SMS of about 50-80%, exhibits a superior cutting service life to the cutting insert that does not satisfy such the condition.

Among the examples (sample numbers 3-2, 4-2, 4-3, 5-2, and 5-3), the sample (sample numbers 4-2 and 5-2) having a low SMS of about 50-70% and a small thin film thickness of about 0.4-0.8 μm exhibits more excellent cutting service life and can be said to be more desirable.

FIG. 1 illustrates a state after a cutting test for a cutting insert according to an example and a comparative example of the invention. As confirmed from FIG. 1, remarkable damage is observed in the edge tip portions of the cutting inserts according to comparative examples when performing cutting for about 4 minutes.

Compared to this, in the cutting insert according to the examples of the invention, the edge tip portion thereof exhibits an excellent state even after about 4 minutes of cutting, and even after performing about 6 minutes of cutting, exhibits a more excellent state than the comparative examples, and thus, it can be found that the cutting insert exhibits a very excellent characteristic for cutting hard-to-cut materials.

Figure 2:
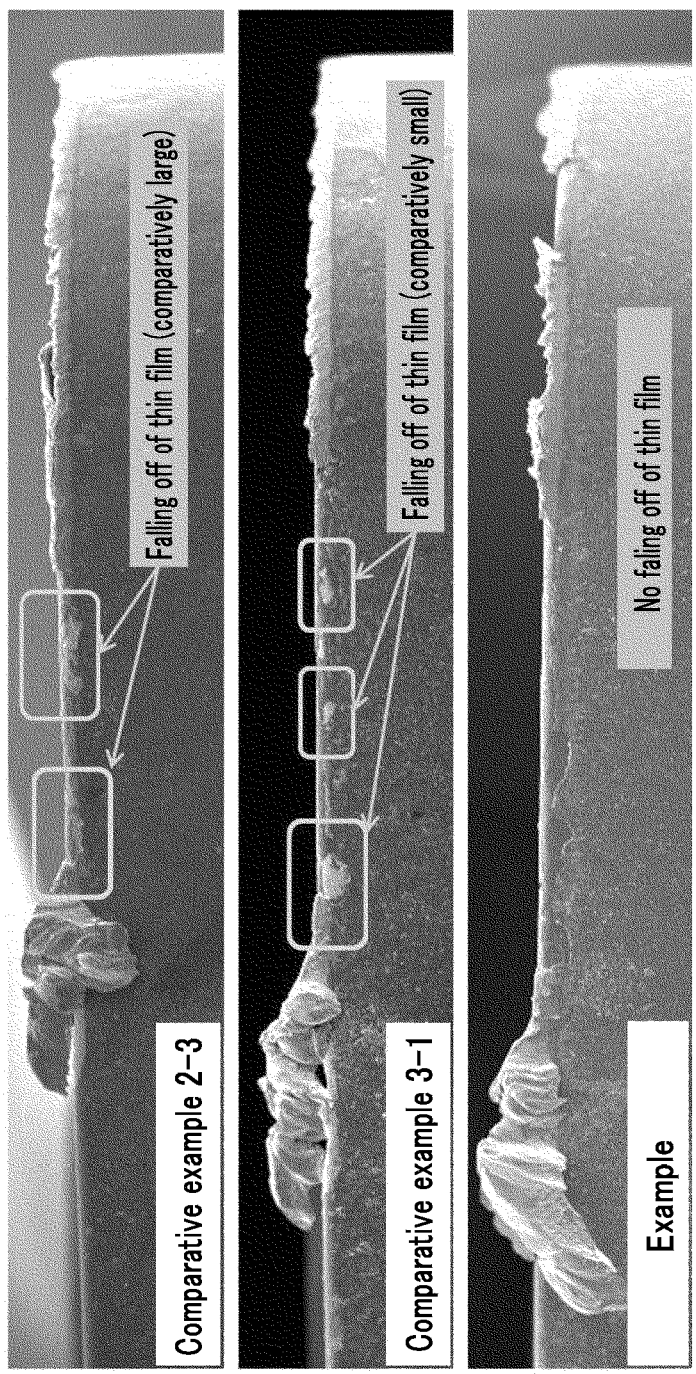
FIG. 2 is an expanded image of an edge tip portion after the cutting test of FIG. 1.

FIG. 2 shows expanded images of edge tip portions after the cutting test of FIG. 1. As confirmed from FIG. 2, in the case of the cutting insert according to comparative example 2-3, comparatively large falling off of a thin film was observed in the edge tip portion after about 60 seconds of cutting, and in the cutting insert according to comparative example 3-1, comparatively small falling off of a thin film was observed in the edge tip portion. Compared to this, in the case of the cutting insert according to example 4-2 of the invention, thin film falling off phenomenon was not observed. That is, it can be found that the difference in cutting performance such as that in Table 2 is substantially affected by whether thin film falling off occurs in the initial stage of cutting.

Thin Film Adhesion Evaluation

In order to confirm the influence affected on a cutting tool by the adhesion strength of the thin film formed on the cutting insert, the cemented carbide base material No. 4 of Table 1 was used, and various metal binding layers as those in Table 3 were formed and applied on the cemented carbide base material, PVD TiAlN coating was then performed to manufacture the cutting insert, and then the cutting performance was evaluated in the same manner as the above method.

TABLE 3

| Base material | Metal binding layer | Adhesion (N) | Film thickness | Cutting service life | Service life termination type |
|---|---|---|---|---|---|
| 4 | absence | 55 | 0.5 | 15 seconds | Initial peeling damage |
| 4 | Ti | 65 | 0.5 | 50 seconds | Initial peeling damage |
| 4 | TiN | 75 | 0.5 | 360 seconds | Termination after normal wear |
| 4 | Cr | 85 | 0.5 | 420 seconds | Termination after normal wear |
| 4 | CrN | 100 | 0.5 | 500 seconds | Termination after normal wear |
| 4 | Ti/TiN | 115 | 0.5 | 490 seconds | Termination after normal wear |

As found form Table 3, it was confirmed that a superior cutting service life is exhibited in the case in which adhesion between the TiAlN thin film formed on the cemented carbide base material and the base material is at least about 75 N compared to those in other cases.

Meanwhile, as a method of improving the adhesion of the ceramic film, various well-known methods such as a pre-treatment method, a binding layer application method, a stress control method, and the like may be applied, and when the adhesion of at least about 75 N (more favorably, at least 80 N) without being limited to methods, the physical property aimed in the invention can be achieved.

As described above, the cutting insert according to the invention is capable of remarkably improving the service life thereof when used in machining of hard-to-cut materials by means of the combination of a base material having improved plastic deformation resistance and a ceramic thin film having reinforced adhesion and hardness, by suppressing peeling or chipping of the ceramic thin film occurring at the cutting edge of the cutting insert under a high temperature and a high pressure.

This work was supported by the Industrial Strategic Technology Development Program(10067065, Development of coated hardmetal/cBN/ceramic cutting tools for machining heat resistant alloys with high hardness, utilized innovation & energy plants industry) funded By the Ministry of Trade, Industry & Energy(MOTIE, Korea) and Korea Evaluation Institute Of Industrial Technology (KEIT, Korea)

What is claimed is:

1. A cutting insert comprising:
   a cemented carbide base material having an SMS value of greater than or equal to 50% and less than 70% obtained by Formula I; and
   a ceramic thin film formed on the cemented carbide base material and having a thickness of 0.4-1.5 μm,
   wherein the Formula I is defined by:

$SMS$=Saturation magnetization value of sintered body×100/$TMS$ ($TMS$=2010×Mass ratio of Co), and wherein the cutting insert is configured for machining titanium or inconel alloys used under a condition of a cutting speed (Vc) of 20 mm/min–100 mm/min.

2. The cutting insert of claim 1, wherein the cemented carbide base material comprises 4-8 wt % of Co, no more than 5 wt % of a grain growth inhibitor including a metal carbide, a metal carbonitride, a metal carbon oxynitride, or a mixture thereof, the metal being at least one selected from metals in periodic table groups 4, 5 and 6 excluding tungsten (W), and the remainder of WC.

3. The cutting insert of claim 2, wherein the cemented carbide base material further comprises any one or more of Gd, Ru, and Re as a reinforcing element, and a sum of the grain growth inhibitor and the reinforcing element is no more than 5 wt %.

4. The cutting insert of claim 1, wherein the cemented carbide base material does not include free carbons.

5. The cutting insert of claim 1, wherein an adhesion between the cemented carbide base material and the ceramic thin film is at least 75 N as measured by a scratch tester.

6. The cutting insert of claim 1, wherein hardness of the ceramic thin film is at least 30 GPa.

7. The cutting insert of claim 1, wherein the ceramic thin film is formed in a multilayer structure with one or more layers comprising $Ti_{1-a-b}Al_aMe_bN$ (Me is at least one selected from among Si, W, Nb, Mo, Ta, Hf, Zr, and Y, where $0.3 \leq a \leq 0.7$, $0 \leq b \leq 0.1$) formed by PVD method.

* * * * *